(12) United States Patent
Liu et al.

(10) Patent No.: US 8,310,319 B2
(45) Date of Patent: Nov. 13, 2012

(54) PULSE WIDTH MODULATOR WITH TWO-WAY INTEGRATOR

(75) Inventors: Jonathan Edward Liu, Milpisas, CA (US); Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/111,860

(22) Filed: May 19, 2011

(65) Prior Publication Data

US 2011/0227627 A1    Sep. 22, 2011

Related U.S. Application Data

(63) Continuation of application No. 12/477,052, filed on Jun. 2, 2009, now Pat. No. 7,965,151.

(51) Int. Cl.
*H03K 7/081* (2006.01)

(52) U.S. Cl. ........ 332/109; 332/110; 332/111; 331/111; 331/143; 327/175

(58) Field of Classification Search .......... 332/109–111; 331/111, 143; 327/74–76, 175; 363/21.1, 363/21.11, 26, 41

See application file for complete search history.

(56) References Cited

U.S. PATENT DOCUMENTS

| 4,450,415 | A | | 5/1984 | Gontowski, Jr. |
| 4,723,114 | A | * | 2/1988 | D'Arrigo et al. ............. 331/111 |
| 4,733,107 | A | * | 3/1988 | O'Shaughnessy et al. ... 327/206 |
| 5,036,300 | A | * | 7/1991 | Nicolai ......................... 331/143 |
| 5,070,311 | A | * | 12/1991 | Nicolai ......................... 331/111 |
| 5,508,664 | A | * | 4/1996 | Rizzo ............................ 331/111 |
| 5,638,031 | A | * | 6/1997 | Danstrom .................... 331/111 |
| 5,912,593 | A | * | 6/1999 | Susak et al. ................... 331/111 |
| 6,229,362 | B1 | | 5/2001 | Choi |
| 6,891,443 | B2 | * | 5/2005 | Rashid ......................... 331/111 |
| 7,053,724 | B2 | * | 5/2006 | Rusu et al. ................... 331/143 |
| 2010/0097828 | A1 | | 4/2010 | Chen |
| 2010/0301821 | A1 | | 12/2010 | Kung et al. |
| 2010/0302811 | A1 | | 12/2010 | Saint-Pierre |

* cited by examiner

*Primary Examiner* — Arnold Kinkead
(74) *Attorney, Agent, or Firm* — Blakely Sokoloff Taylor & Zafman LLP

(57) ABSTRACT

An example two-way integrator includes a first current source, a second current source, a first offset current source, a second offset current source, a capacitor, a switching reference and a comparator. The capacitor integrates a sum of a first input current and a first offset current by charging with both the first current source and the first offset current source. The capacitor subsequently integrates a sum of the second input current and the second offset current by discharging with both the second current source and the second offset current source. The switching reference outputs a first reference voltage and a second reference voltage responsive to pulses of a pulse signal. The comparator is coupled to compare the switching reference with a voltage on the capacitor.

7 Claims, 7 Drawing Sheets

PULSE WIDTH MODULATOR WITH TWO-WAY INTEGRATOR

CROSS-REFERENCE TO RELATED APPLICATION

This application is a continuation of U.S. patent application Ser. No. 12/477,052, filed on Jun. 2, 2009, now pending. U.S. patent application Ser. No. 12/477,052 is hereby incorporated by reference.

BACKGROUND INFORMATION

1. Field of the Disclosure

The present invention relates generally to a pulse width modulator, and more specifically, a pulse width modulator with a two-way integrator.

2. Background

A pulse width modulator (PWM) is a circuit that may be used in applications such as, but not limited to, motor control, switching power converters, or data transmission. A pulse width modulator may output a PWM signal that is a logic signal that switches between two logic states, such as a logic high state and a logic low state. In one design of a PWM, a capacitor may be used to integrate an input current representative of an input signal to determine a duty ratio during each sequential period of the PWM signal. The PWM signal is designed to vary the duty ratio according to one or more inputs. More specifically, the duty ratio may be defined as the ratio of time the PWM signal is in a certain logic state over a given time period. Typically, duty ratio is the amount of time the PWM signal is in the logic high state over a given period $T_S$. A period $T_S$, may be defined as the time duration of one complete cycle of the PWM signal. More specifically, a complete cycle of the PWM signal may be defined by the duration of time between when the PWM signal is switched to the first state and when the PWM signal is again switched to the first state.

A practical consideration in designing a PWM is determining the maximum duty ratio of the PWM signal. This can be important for many possible reasons. In the PWM that includes a capacitor to integrate, it may be necessary to control the maximum duty ratio such that enough time is available to allow the capacitor to reset (discharge), so it can be ready to integrate at the start of the next period $T_S$. For example, if a maximum duty ratio is set to 99% while maintaining the PWM signal frequency above 66 KHz, the capacitor will only have 1% of the period, which is 150 ns, to reset the capacitor before start of the next period $T_S$.

To further complicate the issue, the design of the capacitor used may also have a non-linearly changing capacitance at low voltages. In order to maintain proper functionality of the pulse width modulator, an offset to the voltage range in which the capacitor is allowed to integrate is implemented such that integration of the input current occurs where the capacitor value operates in a linear range. For example, due to the nature of the materials used for capacitors in an integrated circuit, the capacitor may integrate inconsistently when a voltage across the capacitor is under 1V, and thus the capacitor may only integrate starting from an offset voltage of 1V. This prevents the capacitor from using a ground node (0 V) and being reset to zero V. Therefore, the capacitor must not only be able to reset within a short time frame because of a high duty cycle (i.e 99%), but also may need to reset to a pre-determined set voltage reference (i.e 1V) to avoid integrating in a non-linear region of the capacitor.

In one example, an LED (light emitting diode) light source is powered by a source of dc power. Because power is generally delivered through a wall outlet as high-voltage ac power, a device, such as a power converter, is required to transform the high-voltage ac power to usable dc power for the LED light source. In operation, a power converter controller, included in the power converter, may output a PWM signal to drive a power switch of the power converter to control the amount of power delivered to the LED light source. In one example, feedback information representative of the output voltage and/or output current at the LED light source may be input to the PWM to adjust the duty ratio of the PWM signal. In this manner, a desired output voltage, output current, and/or output power at the output of the power converter may be regulated.

BRIEF DESCRIPTION OF THE DRAWINGS

Non-limiting and non-exhaustive embodiments and examples of the present invention are described with reference to the following figures, wherein like reference numerals refer to like parts throughout the various views unless otherwise specified.

DETAILED DESCRIPTION

A two-way integrator included in a PWM to allow for increasing a maximum duty ratio of a PWM signal is disclosed. More specifically, a duty ratio in a period of a PWM signal is to be set by charging a capacitor from a first reference to a second reference and a duty ratio in a subsequent period of the PWM signal is to be set by discharging the capacitor from the second reference to the first reference. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

Figure 1:
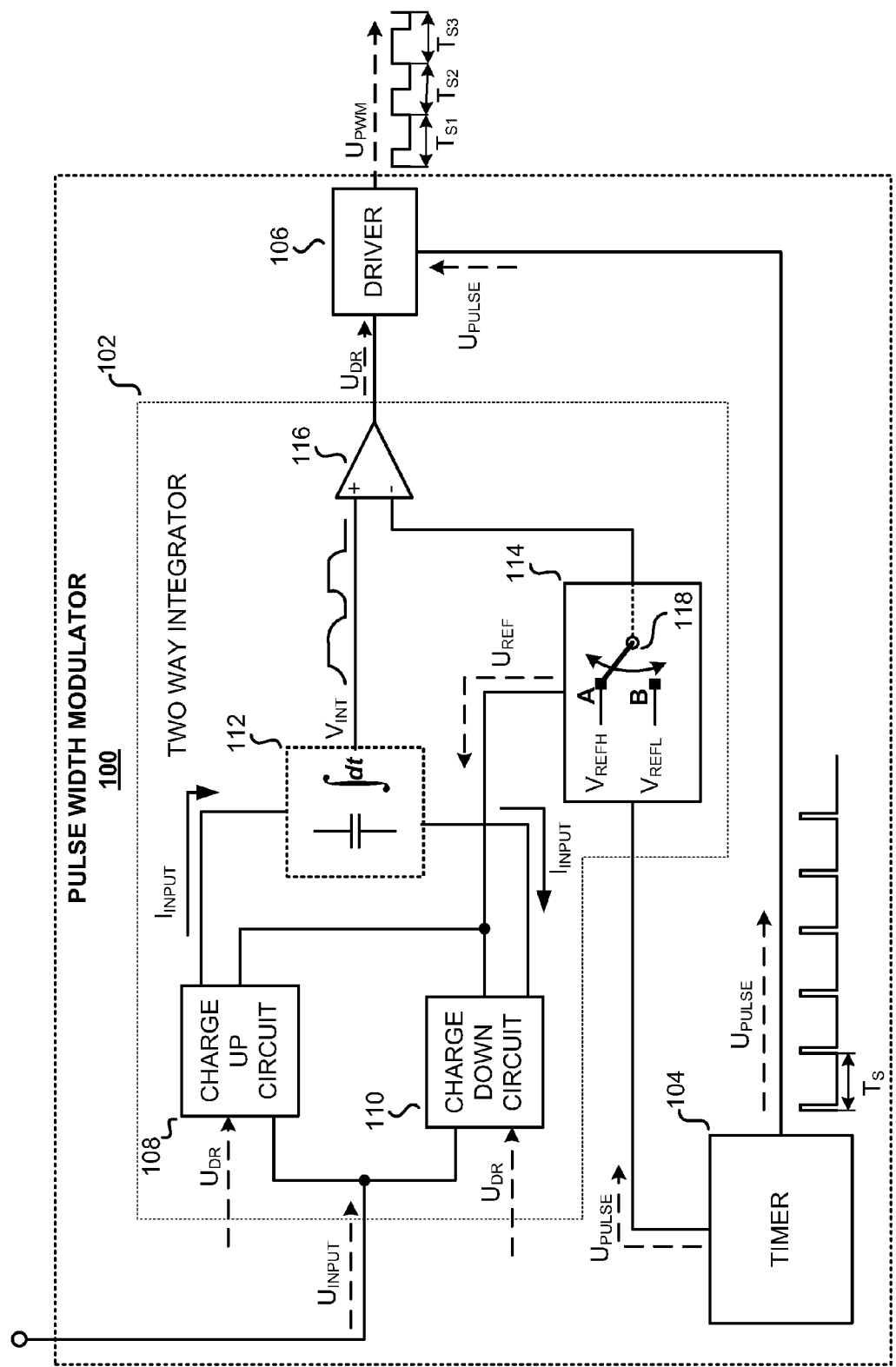
FIG. 1 is a functional block diagram illustrating an example pulse width modulator (PWM) including a two-way integrator and a timer, in accordance with the teachings of the present invention.

Referring now to FIG. 1, a functional block diagram illustrates a pulse width modulator (PWM) 100, in accordance with the teachings of the present invention. In the example embodiment of FIG. 1, PWM 100 includes a two-way integrator 102, a timer 104, and a driver 106. As shown, two-way integrator 102 is coupled to output a duty ratio signal $U_{DR}$ to driver 106 and timer 104 is coupled to output a pulse signal $U_{PULSE}$ to driver 106. As further shown, driver 106 outputs a high maximum duty ratio PWM signal $U_{PWM}$, from hereon referred to as PWM signal $U_{PWM}$. In one example, PWM signal $U_{PWM}$ may be used to drive a power switch of a power converter, or may serve as a data transmission signal, or control the drive of a motor. In operation, two-way integrator 102 outputs duty ratio signal $U_{DR}$ in response to an input signal $U_{INPUT}$ and pulse signal $U_{PULSE}$. In one example, input signal $U_{INPUT}$ is representative of any input that will adjust the duty ratio of PWM signal $U_{PWM}$ in response to changes in magnitude of the input signal $U_{INPUT}$. In one example, input signal $U_{INPUT}$ may be representative of, but not limited to, an input voltage, input current, and/or an output voltage of a power converter. In another example, input signal $U_{INPUT}$ may be representative of feedback information to control an output of a motor.

As shown, two-way integrator 102 includes a charge up circuit 108, a charge down circuit 110, a capacitor 112, a switching reference 114, and a comparator 116. In operation, timer 104 outputs pulse signal $U_{PULSE}$ to driver 106 to set sequential periods $T_S$ for PWM signal $U_{PWM}$. More specifically, each time pulse signal $U_{PULSE}$ is pulsed, driver 106 sets PWM signal $U_{PWM}$ to a logic high state. In one embodiment, pulse signal $U_{PULSE}$ is such that it sets a constant period $T_S$ for PWM signal $U_{PWM}$. In another embodiment, timer 104 may vary pulse signal $U_{PULSE}$ in response to an additional input to vary the length of sequential periods $T_S$ of PWM signal $U_{PWM}$. In one embodiment, timer 104 may limit the length of sequential periods $T_S$ of pulse signal $U_{PULSE}$ to prevent PWM signal $U_{PWM}$ from dropping below a minimum PWM frequency that may be specified by the application using PWM 100.

In one example embodiment, duty ratio signal $U_{DR}$ sets the duty ratio of PWM signal $U_{PWM}$. More specifically, the duty ratio is the ratio of time the PWM signal $U_{PWM}$ is set in a logic high state with respect to its respective period $T_S$. In operation, charge up circuit 108 outputs an input current $I_{INPUT}$. In one example, input current $I_{INPUT}$ is representative of input signal $U_{INPUT}$. In operation, input current $I_{INPUT}$ is received by capacitor 112. More specifically, capacitor 112 begins to integrate input current $I_{INPUT}$ at the start of a period $T_{S1}$, coincident with the pulse signal $U_{PULSE}$ adjusting the PWM signal $U_{PWM}$ to a logic high state. When voltage $V_{INT}$ across capacitor 112 reaches a voltage reference $V_{REFH}$, comparator 116 outputs a duty ratio signal $U_{DR}$ that causes PWM signal $U_{PWM}$ to transition from a logic high state to a logic low state. For a subsequent period $T_{S2}$, capacitor 112 will perform integration of input current $I_{INPUT}$ by discharging capacitor 112 from high voltage reference $V_{REFH}$ to a low voltage reference $V_{REFL}$. As with the prior period, at the start of the period $T_{S2}$, Timer 104 pulses $U_{PULSE}$ which causes driver 106 to set PWM signal $U_{PWM}$ to a logic high state. When the voltage across capacitor 112 reaches low voltage reference $V_{REFL}$, comparator 116 outputs a duty ratio signal $U_{DR}$ that causes PWM signal $U_{PWM}$ to transition from a logic high state to a logic low state. During a next period $T_{S3}$, integration is now performed by, again, charging capacitor 112 from the voltage reference $V_{REFL}$ to the voltage reference $V_{REFH}$. In this manner, the input current representative of an input signal $U_{INPUT}$ is integrated to control a duty ratio of a PWM signal $U_{PWM}$. By employing the two-way integration technique as described in accordance with the teachings of the present invention the maximum duty ratio for a switching period $T_S$ may reach 100% since no time may be necessary to reset capacitor 112 to a starting voltage before the next switching period $T_S$.

In one example, capacitor 112 is a discrete passive component having a capacitance. In another example, capacitor 112 includes several discrete passive components coupled together having a total effective capacitance. In yet another example, capacitor 112 includes one or more active components that provide an effective capacitance for integrating input current $I_{INPUT}$. In still another example, capacitor 112 may include an integrated circuit, in accordance with the teachings of the present invention.

As shown, switching reference 114 includes a switch 118 that switches between voltage reference $V_{REFH}$ and voltage reference $V_{REFL}$. In operation, when capacitor 112 is charging, switch 118 is in position A and switching reference 114 is representative of voltage reference $V_{REFH}$. When capacitor 112 is discharging, switch 118 is in position B and switching reference 114 is representative of voltage reference $V_{REFL}$. In one example, switching reference 114 outputs a reference signal $U_{REF}$ that is a logic signal indicating whether switch 118 is in position A or position B (i.e., whether switching reference 114 is outputting voltage reference $V_{REFH}$ or voltage reference $V_{REFL}$).

Figure 2:
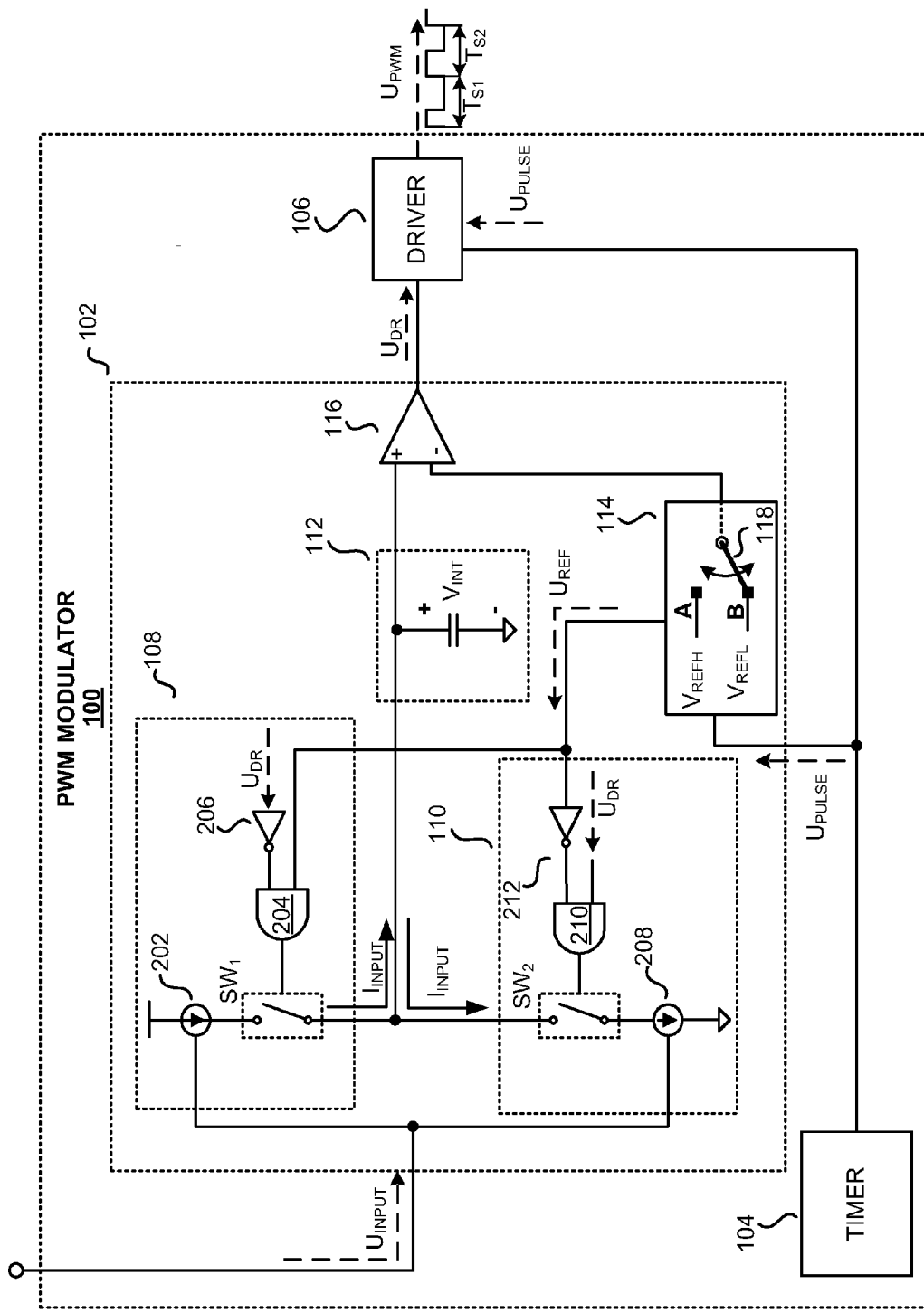
FIG. 2 further illustrates the two-way integrator included in the example PWM of FIG. 1, in accordance with the teachings of the present invention.

Referring now to FIG. 2, the two-way integrator 102 in FIG. 1 is further illustrated, in accordance with the teachings of the present invention. As shown, charge up circuit 108 includes a current source 202 that sources a current $I_{INPUT}$, a first switch SW1, a logic AND gate 204, and an inverter 206. As further shown, charge down circuit 110 includes a current source 208 that sinks a current $I_{INPUT}$, a second switch SW2, a logic AND gate 210, and an inverter 212. In operation, charge up circuit 108 conducts input current $I_{INPUT}$ through switch SW1 when output of logic AND gate 204 is in a logic high state. In one example, logic AND gate 204 receives reference signal $U_{REF}$ and duty ratio signal $U_{DR}$ as inputs. According to the illustrated example, reference signal $U_{REF}$ is in a logic high state when switching reference 114 is representative of voltage reference $V_{REFH}$ and is in a logic low state when switching reference 114 is representative of a voltage reference $V_{REFL}$. As a result, switch SW1 conducts input current $I_{INPUT}$ to charge capacitor 112 until the voltage $V_{INT}$ across capacitor 112 reaches reference voltage $V_{REFH}$. When voltage $V_{INT}$ is substantially equal to reference voltage $V_{REFH}$, duty ratio signal $U_{DR}$ is set to a logic high state by comparator 116. As a result, PWM signal $U_{PWM}$ is set to a logic low state. In this manner, the duty ratio of period $T_{S1}$ of PWM signal $U_{PWM}$ is controlled in response to integrating an input current $I_{INPUT}$.

Figure 3:
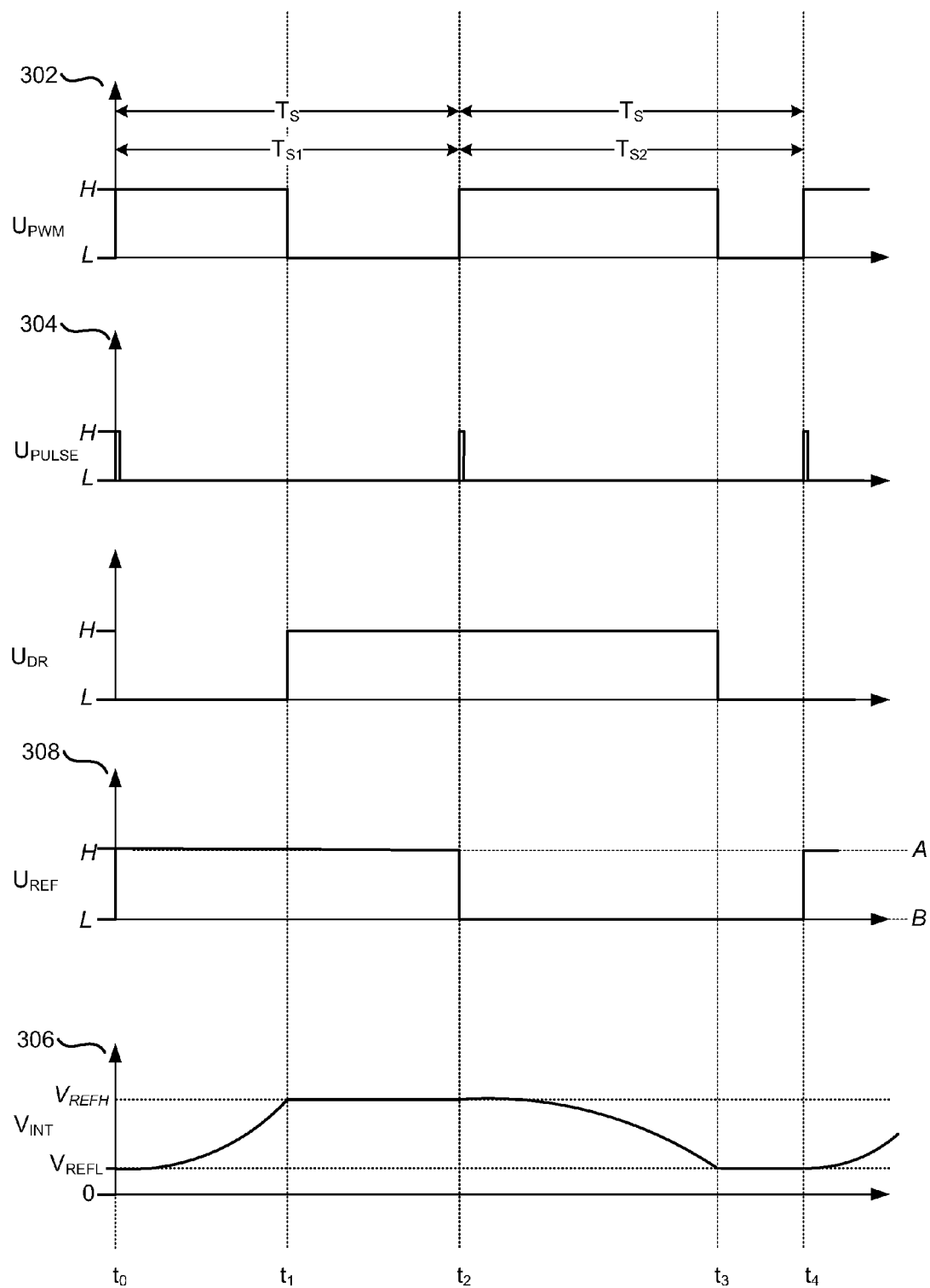
FIG. 3 is a timing diagram illustrating particular waveforms of signals associated with the PWM of FIG. 1, in accordance with the teachings of the present invention.

Continuing with the example, pulse signal $U_{PULSE}$ initiates the beginning of a subsequent period $T_{S2}$ by setting PWM signal $U_{PWM}$ from a logic low state to a logic high state. In operation, switching reference 114 may set switch 118 from position A to a position B such that switching reference 114 is representative of a voltage reference $V_{REFL}$ in response to pulse signal $U_{PULSE}$. In one example, switching reference 114 may toggle between positions A and B each time pulse signal $U_{PULSE}$ is set to a logic high state. In this manner, the switching reference 114 will be adjusted from voltage reference $V_{REFH}$ to voltage reference $V_{REFL}$ for period $T_{S2}$ of PWM signal $U_{PWM}$, as shown in the waveforms of FIG. 3. In operation, switch SW2 of charge down circuit 110, conducts input current $I_{INPUT}$ when logic AND gate 210 is set to a logic high state. As a result, switch SW2 conducts input current $I_{INPUT}$ until the voltage $V_{INT}$ across capacitor 112 is discharged to reference voltage $V_{REFL}$. When voltage $V_{INT}$ is substantially equal to reference voltage $V_{REFL}$, duty ratio signal $U_{DR}$ is set to a logic low state by comparator 116. As a result, PWM signal $U_{PWM}$ is set to a logic low state. In this manner, the duty ratio of a subsequent period $T_{S2}$ of PWM signal $U_{PWM}$ is controlled in response to integrating an input current $I_{INPUT}$ by discharging capacitor 112.

In summary, capacitor 112, charge up circuit 108, charge down circuit 110, and comparator 116 function as a two-way integrator that determines a duty ratio of a period $T_{S1}$ of a PWM signal $U_{PWM}$ by charging up capacitor 112 to a voltage reference $V_{REFH}$ and determines a duty ratio for a subsequent period $T_{S2}$ of a PWM signal $U_{PWM}$ by discharging capacitor 112 to a voltage reference $V_{REFL}$.

Referring now to FIG. 3, a timing diagram illustrates signals of PWM 100 in accordance with the teachings of the present invention. As shown, period $T_{S1}$ is defined to be between time $t_0$ and $t_2$, and subsequent period $T_{S2}$ is defined to be between time $t_2$ and time $t_4$. As shown, waveform 302 illustrates PWM signal $U_{PWM}$. As shown, waveform 304 of pulse signal $U_{PULSE}$ illustrates a pulsed signal at the beginning of every period $T_S$. In operation, when pulse signal $U_{PULSE}$ is set to a high logic state (or pulsed), PWM signal $U_{PWM}$ is set to a logic high state that mark the beginning of periods $T_{S1}$ and $T_{S2}$. In this manner, PWM signal $U_{PWM}$ marks the beginning of a new period $T_S$ when set to a logic high state. As shown, a waveform 306 illustrating voltage $V_{INT}$ across capacitor 112, reaches voltage reference $V_{REFH}$ at a time $t_1$. As discussed above, comparator 116 sets duty ratio signal $U_{DR}$ to a logic high state in response to voltage $V_{INT}$ reaching voltage reference $V_{REFH}$. As further shown, PWM signal $U_{PWM}$ switches from a high state to a logic low state in response to duty ratio signal $U_{DR}$ switching logic states. In this manner, duty ratio signal $U_{DR}$ adjusts the duty ratio of PWM signal $U_{PWM}$ during period $T_{S1}$. As shown in waveform 308, reference signal $U_{REF}$ is in a position A, which is representative of logic high state, till a time $t_2$. In operation, reference signal $U_{REF}$ is set to a position A for the period $T_{S1}$ and is set to a position B for the period $T_{S2}$. As shown, during the subsequent time period $T_{S2}$ which starts at time $t_2$, capacitor 112 has not been reset during period $T_{S1}$ in order to again perform integration for the subsequent period $T_{S2}$. Instead, two-way integrator 102 performs integration by alternating between charging and discharging capacitor 112 between voltage reference $V_{REFH}$ and $V_{REFL}$. As shown in waveform 306, during time $t_1$ and $t_2$ voltage $V_{INT}$ across capacitor 112 is not discharged to reset capacitor 112 to allow for integration by charging during the next time period $T_{S2}$. Instead, capacitor 112 performs integration by discharging capacitor 112 during time period $T_{S2}$ between time $t_2$ and $t_3$. This allows substantially zero reset time for capacitor 112 in order to perform integration for capacitor 112, and duty ratio of PWM signal $U_{PWM}$ may be substantially 100%. In one example, voltage reference $V_{REFL}$ is offset from 0 V so that capacitor 112 may only integrate input current $I_{INPUT}$ in a region where the capacitance value of capacitor 112 is relatively constant. In other words, in one example, the capacitor 112 may only charge and discharge between a voltage range which capacitor 112 may operate linearly. In one example, $V_{REFL}$ may be substantially equal to 1V. In another example $V_{REFL}$ may be set to zero.

Figure 4:
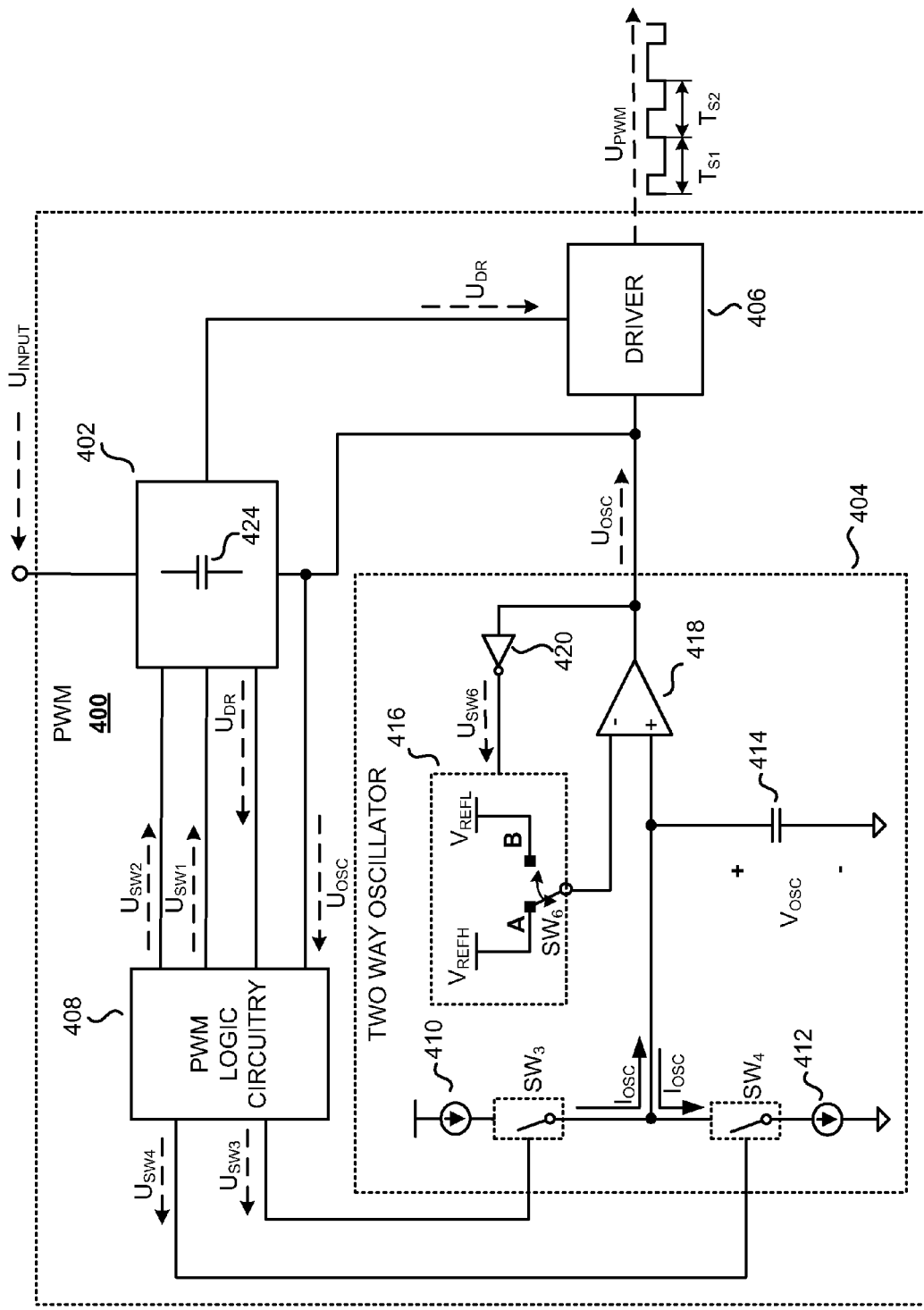
FIG. 4 is a functional block diagram illustrating a pulse width modulator (PWM) including a two-way integrator and a two-way oscillator, in accordance with the teachings of the present invention.

Referring now to FIG. 4, a functional block diagram illustrates an example pulse width modulator 400, in accordance with the teachings of the present invention. As shown, pulse width modulator 400 includes a two-way integrator 402, a two-way oscillator 404, a driver 406, and PWM logic circuitry 408. In one example, two-way integrator 402, and driver 406 represent possible implementations of two-way integrator 102 and driver 106, respectively of PWM 100. In one example, two-way oscillator 404 performs the same function of setting the period $T_S$ of PWM signal $U_{PWM}$ as timer 104 of PWM 100. As shown, two-way integrator 402 is coupled to output duty ratio signal $U_{DR}$ to driver 106, and two-way oscillator 404 is coupled to output an oscillator signal $U_{OSC}$ to driver 406. In one example, oscillator signal $U_{OSC}$ is similar in function to the pulse signal $U_{PULSE}$ used in conjunction with PWM 100. In operation, oscillator signal may be designed to set a period $T_S$ of PWM signal $U_{PWM}$. As further shown, driver 406 outputs a high maximum duty ratio PWM signal, $U_{PWM}$, from here on referred to as PWM signal $U_{PWM}$. In operation, two-way integrator 402 outputs duty ratio signal $U_{DR}$ in response to input signal $U_{INPUT}$. As shown, two-way oscillator includes a current source 410, a current source 412, switch SW3, switch SW4, switch SW6, capacitor 414, switching reference 416, comparator 418, and inverter 420. In one example, two-way oscillator 404 functions in a similar manner to two-way integrator 402. In operation, two-way oscillator 404 sets a period $T_{S1}$ for PWM signal $U_{PWM}$ by charging capacitor 414 with current source 410. Similarly, oscillator signal $U_{OSC}$ sets a subsequent period $T_{S2}$ by discharging capacitor 414 with current source 412. In this manner, two-way oscillator 404 outputs oscillator signal $U_{OSC}$ that sets sequential time periods for PWM signal $U_{PWM}$. In operation, switch signal $U_{SW3}$ is set to a logic high state to allow switch SW3 to conduct oscillator current $I_{OSC}$ during period $T_{S1}$ to charge capacitor 414. Conversely, switch signal $U_{SW4}$ is set to a logic high state to allow switch SW4 to conduct oscillator current $I_{OSC}$ during subsequent period $T_{S2}$ to discharge capacitor 414. As shown, comparator 418 receives an oscillator voltage $V_{OSC}$ from capacitor 414 and a voltage reference from switching voltage reference 416. In operation, when comparator 418 switches between logic states, switch signal $U_{SW6}$ switches logic states which switch the voltage reference of switching reference 416. In this manner, switching reference 416 switches between voltage reference $V_{REFH}$ and voltage reference $V_{REFL}$ at the beginning of each period $T_S$ of PWM signal $U_{PWM}$. In addition, when comparator 418 switches logic states, oscillator signal $U_{OSC}$ indicates to driver 406 to set PWM signal $U_{PWM}$ to a logic high state.

Figure 5:
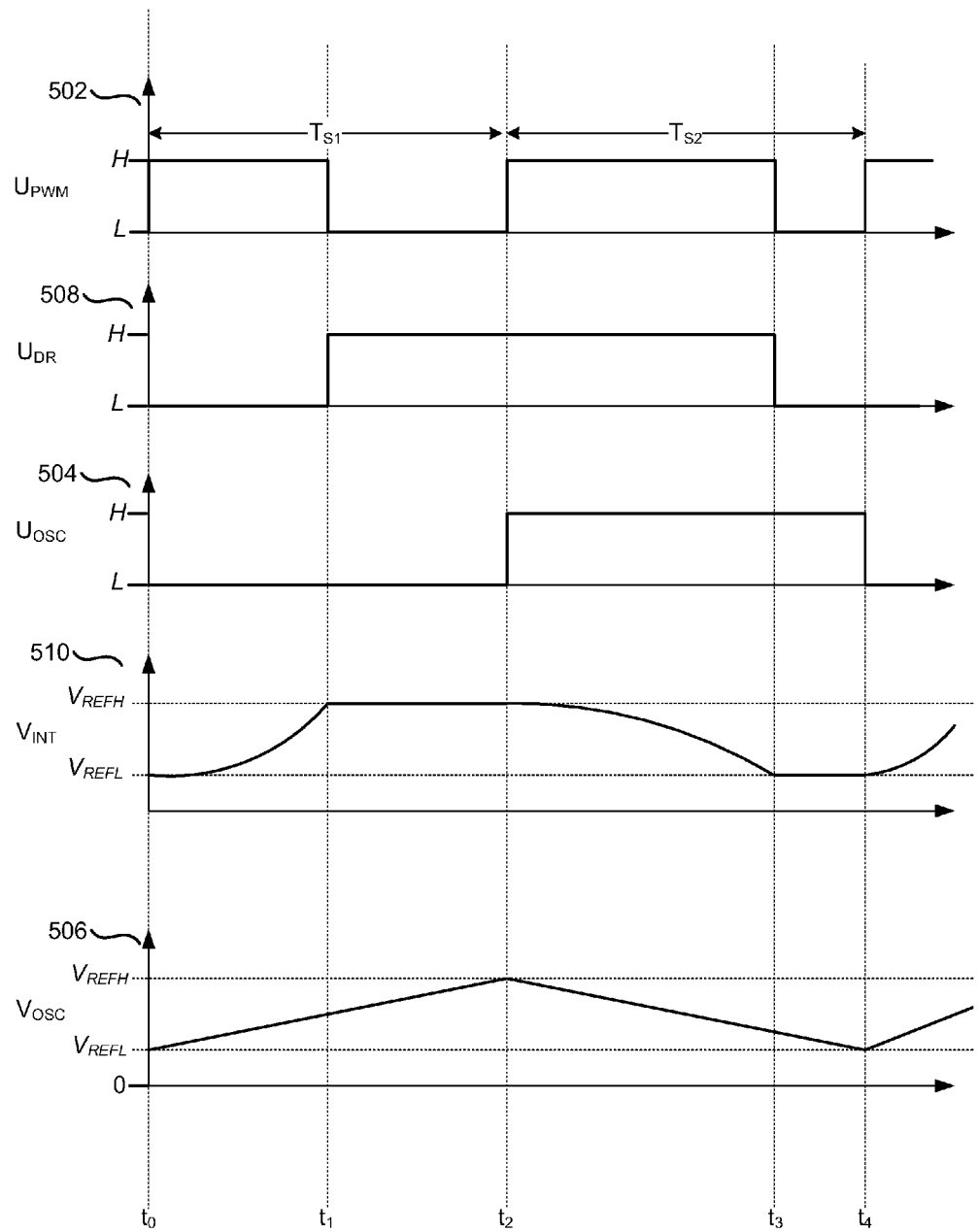
FIG. 5 is a timing diagram illustrating particular waveforms of signals associated with the PWM of FIG. 4, in accordance with the teachings of the present invention.

Referring now to FIG. 5, a timing diagram illustrates signals of PWM 400 in accordance with the teachings of the present invention. As shown, a period $T_{S1}$ is defined to be between time $t_0$ and $t_2$, and a subsequent period $T_{S2}$ is defined to be between time $t_2$ and time $t_4$. As shown, waveform 502 illustrates PWM signal $U_{PWM}$ for the sake of a timing reference with respect to other signals of PWM 400. As further shown in waveform 504, oscillator signal $U_{OSC}$ switches logic states at times $t_2$ and $t_4$, which mark the end of period $T_{S1}$ and subsequent period $T_{S2}$. As shown in waveform 506, oscillator voltage $V_{OSC}$ increases from a reference voltage $V_{REFL}$ to a reference voltage $V_{REFH}$ during period $T_{S1}$. When oscillator voltage $V_{OSC}$ reaches reference voltage $V_{REFH}$, oscillator signal $U_{OSC}$ switches from logic low state to a logic high state. As shown, oscillator voltage $V_{OSC}$ decreases from reference voltage $V_{REFH}$ to $V_{REFL}$ during subsequent switching period $T_{S2}$. When oscillator voltage $V_{OSC}$ reaches reference voltage $V_{REFL}$, oscillator signal $U_{OSC}$ switches from a logic high state to a logic low state. When oscillator signal $U_{OSC}$ switches logic states, PWM signal begins a new period $T_S$ and switches PWM signal $U_{PWM}$ from a logic low state to a logic high state. In this manner, $U_{OSC}$ sets sequential periods $T_S$ of PWM signal $U_{PWM}$. In one example, sequential periods $T_S$ are constant, thus allowing PWM signal $U_{PWM}$ to maintain a constant frequency. As shown in waveform 508, duty ratio signal $U_{DR}$ switches logic states when integration voltage $V_{INT}$, shown in waveform 510, reaches voltage reference $V_{REFH}$ when capacitor 424 is charging or when $V_{INT}$ reaches voltage reference $V_{REFL}$ when capacitor 424 is discharging. In another example, oscillator capacitor 414 and an integrator capacitor 424 are matched such that, the time that it takes capacitors 414 and 424 to charge (or discharge) to one of the voltage references is the same. In yet another example, oscillator capacitor 414 and integrator capacitor 424 are matched and additional offset current sources are added to ensure that integrator capacitor 424 is fully charged/discharged to its reference voltage before the beginning of the next switching period, as will be discussed in more detail below with reference to FIG. 6.

Figure 6:
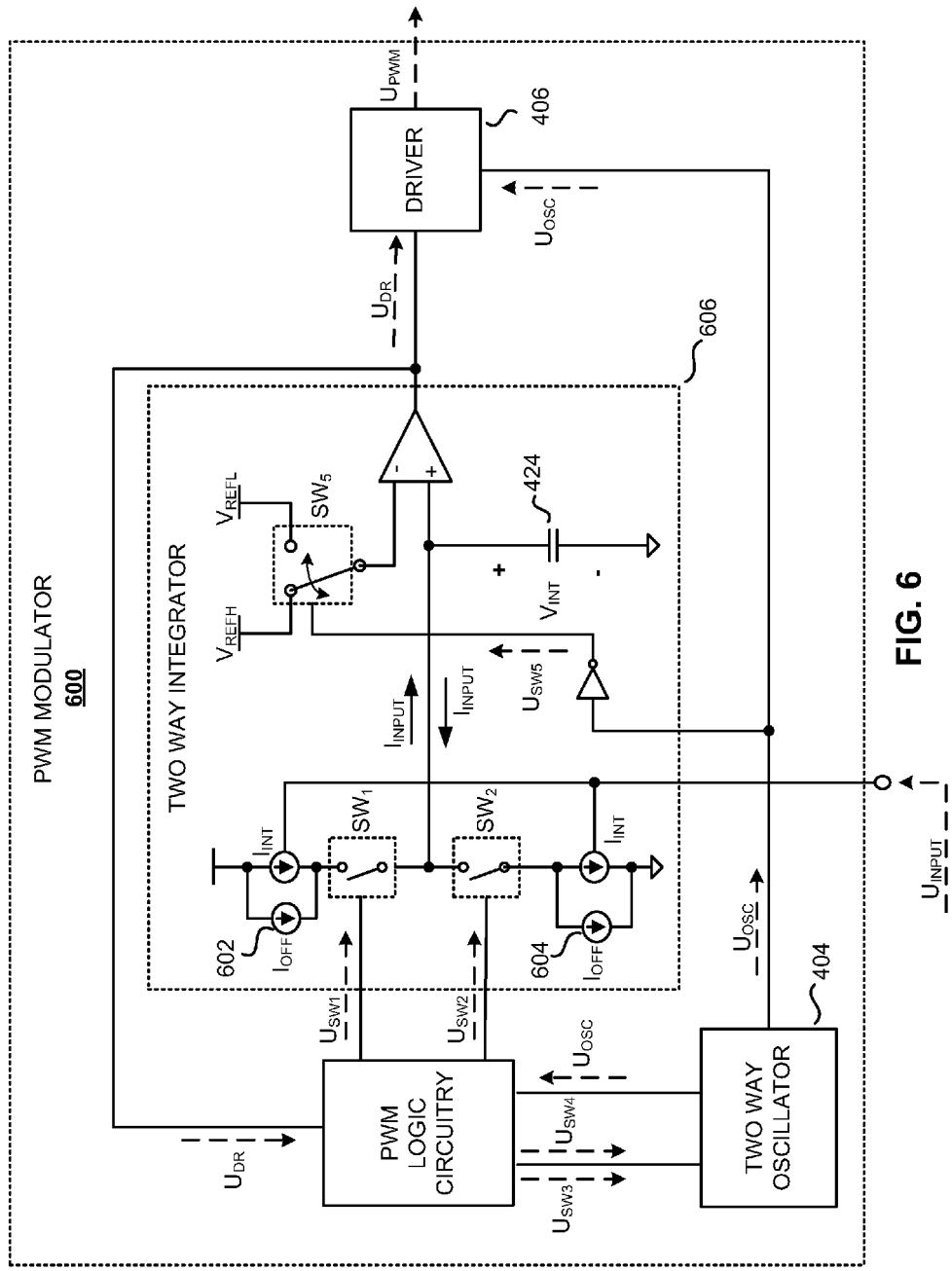
FIG. 6 further illustrates the two-way integrator included in the example PWM of FIG. 4, in accordance with the present invention.

Referring now to FIG. 6, a functional block diagram illustrates the example PWM 600 with additional offset current sources in accordance with the teachings of the present invention. In one example, offset current sources 602 and 604 are included in PWM 600 to ensure that integrator capacitor 424 is charged/discharged to its reference voltage before the beginning of the next switching period. For example, two-way integrator 606 includes additional offset current sources 602 and 604 that produce a current $I_{OFF}$. Thus, in the illustrated example, input current $I_{INPUT}$ is equal to the offset current $I_{OFF}$ plus integrator current $I_{INT}$. In one example, offset current sources 602 and 604 may be used when voltage reference $V_{REFH}$ and $V_{REFL}$ is designed to vary. More specifically, offset current $I_{OFF}$ may incorporate the changes of voltage references $V_{REFH}$ and $V_{REFL}$. More specifically, voltage references $V_{REFH}$ and $V_{REFL}$ may effectively vary, and still be implemented as constant reference values. This allows the added benefit of effectively varying the voltage reference and still prevents integrator capacitor 424 from having to reset for a next period $T_S$, since integrator capacitor 424 is still charging and discharging to fixed voltage references. For example, voltage references $V_{REFH}$ and $V_{REFL}$ may vary as a hyperbolic function when PWM signal $U_{PWM}$ is used in a switching power converter. In another example, offset current sources 602 and 604 allow integrator capacitor 424 to reach reference voltage $V_{REFH}$ or $V_{REFL}$ before the oscillator capacitor (e.g., see oscillator capacitor 414 shown in FIG. 4) reaches reference voltage $V_{REFH}$ or $V_{REFL}$, respectively. More specifically, current sources 602 and 604 provide a fixed current equal to the oscillator current (e.g., oscillator current $I_{OSC}$ shown in FIG. 4), while integrator current $I_{INT}$ is a variable current responsive to the input signal $U_{INPUT}$. In another example, the oscillator capacitor and the integrator capacitor 424 are matched in a way such that if identical currents are injected into each, the resulting voltage rise across each capacitor will be the same. The matching of oscillator and integrator capacitors may ensure that the accuracy of the duty ratio of PWM signal $U_{PWM}$ is maintained across temperature and parameter variations of PWM 600.

With offset current $I_{OFF}$ equal to the value of oscillator current $I_{OSC}$ and integrator current $I_{INT}$ responsive to the input signal $U_{INPUT}$, integrator capacitor 424 will reach voltage reference $V_{REFH}$ or $V_{REFL}$ before the oscillator capacitor reaches voltage reference $V_{REFH}$ or $V_{REFL}$ during each switching period. Thus, in one example, the duration of time that it takes oscillator current to charge the oscillator capacitor to reference voltage $V_{REFH}$ is greater than the duration of time that it takes the input current $I_{INPUT}$ to charge the integrator capacitor 424 to the reference voltage $V_{REFH}$. Similarly, the duration of time that it takes oscillator current to discharge the oscillator capacitor to the reference voltage $V_{REFL}$ is greater than the duration of time that it takes the input current $I_{INPUT}$ to discharge the integrator capacitor 424. In another example, $I_{OFFSET}$ may be used to adjust the maximum duty ratio of PWM signal $U_{PWM}$ by increasing the current in the integrator capacitor 424 to reach voltage reference $V_{REFH}$ or $V_{REFL}$ at a faster rate. In one embodiment, voltage references $V_{REFH}$ and $V_{REFL}$ may be different values for integrator capacitor 424 and oscillator capacitor 414.

Figure 7:
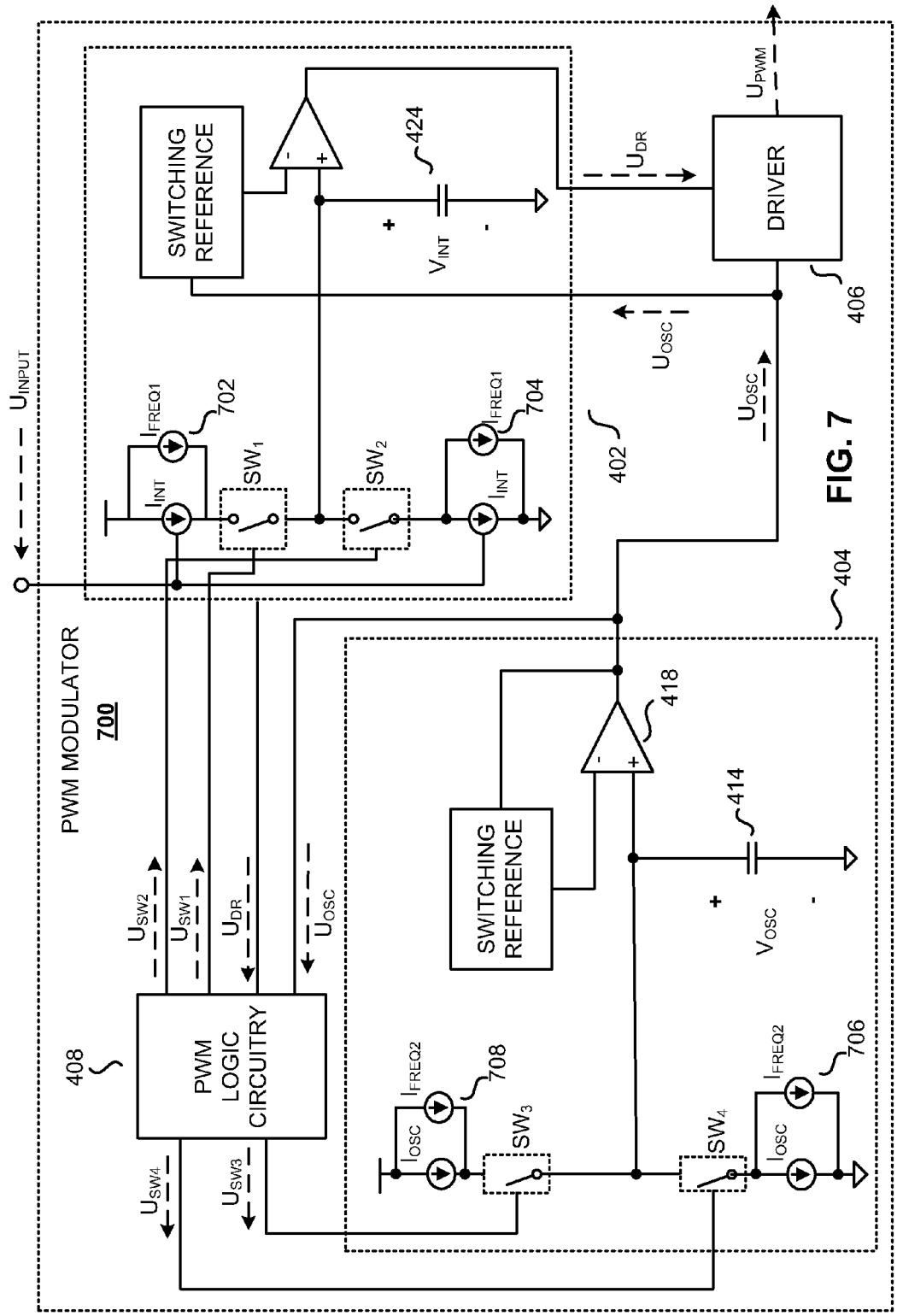
FIG. 7 is a functional block diagram illustrating a pulse width modulator (PWM) including a two-way integrator and a two-way oscillator including additional offset current sources, in accordance with the teachings of the present invention.

Referring now to FIG. 7, a functional block illustrates the example PWM 400 with additional current sources in accordance with the teachings of the present invention. As shown, additional current sources 702 and 704 are included in two-way integrator 402 that output frequency adjust current $I_{FREQ1}$ and additional current sources 706 and 708 are included in two-way oscillator 404 output frequency adjust current $I_{FREQ2}$. In one example, frequency adjust currents $I_{FREQ1}$ and $I_{FREQ2}$ may be adjusted to change the frequency of PWM signal $U_{PWM}$ and still keep the duty ratio of PWM signal $U_{PWM}$ constant. In one example, frequency adjust current $I_{FREQ1}$ and $I_{FREQ2}$ may vary. In another example, frequency adjust current $I_{FREQ1}$ and $I_{FREQ2}$ may be adjusted in response to an input (not shown). In one example this allows a jittering of the frequency of PWM signal $U_{PWM}$. This feature, allows for varying the switching frequency over a specified range to spread the energy of switching harmonics over larger frequency bands and reduce electromagnetic interference (EMI).

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The term used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A two-way integrator, comprising:
a first current source coupled to source a first input current that is representative of an input signal and that varies as a magnitude of the input signal changes;

a second current source coupled to sink a second input current that is representative of the input signal and that varies as the magnitude of the input signal changes;

a first offset current source coupled to source a first offset current;

a second offset current source coupled to sink a second offset current;

a capacitor coupled to integrate a sum of the first input current and the first offset current by charging with the first current source and with the first offset current source when a reference signal is at a first logic state, wherein the capacitor is further coupled to integrate a sum of the second input current and the second offset current by discharging with the second current source and with the second offset current source when the reference signal is at a second logic state;

a switching reference coupled to receive a pulse signal, wherein the switching reference is adapted to output a first reference voltage responsive to a first pulse of the pulse signal and to output a second reference voltage responsive to a subsequent pulse of the pulse signal; and a comparator coupled to compare the output of the switching reference with a voltage on the capacitor.

2. The two-way integrator of claim 1, wherein the first reference voltage and the second reference voltage are variable reference voltages.

3. The two-way integrator of claim 2, wherein the first reference voltage and the second reference voltage vary as a hyperbolic function.

4. The two-way integrator of claim 2, wherein the first offset current source is adapted to incorporate changes in the first reference voltage and wherein the second offset current source is adapted to incorporate changes in the second reference voltage.

5. The two-way integrator of claim 1, wherein the switching reference is coupled to generate the reference signal, wherein the first current source is coupled to be enabled responsive to the reference signal being in the first logic state and wherein the second current source is coupled to be enabled responsive to the reference signal being in the second logic state.

6. The two-way integrator of claim 1, wherein the first and second current sources are variable current sources, each having a control input coupled to receive the input signal.

7. The two-way integrator of claim 1, wherein the first current source is coupled to be disabled while the second current source is enabled and wherein the second current source is coupled to be disabled while the first current source is enabled.

\* \* \* \* \*